US006801102B2

(12) United States Patent
Shamsaifar et al.

(10) Patent No.: US 6,801,102 B2
(45) Date of Patent: Oct. 5, 2004

(54) TUNABLE FILTERS HAVING VARIABLE BANDWIDTH AND VARIABLE DELAY

(75) Inventors: Khosro Shamsaifar, Ellicot City, MD (US); Yongfei Zhu, Columbia, MD (US); John Kvarnstrand, Ellicott City, MD (US); Louise Sengupta, Ellicott City, MD (US)

(73) Assignee: Paratek Microwave Incorporated, Columbia, MD (US)

( * ) Notice: Subject to any disclaimer, the term of this patent is extended or adjusted under 35 U.S.C. 154(b) by 0 days.

(21) Appl. No.: 10/252,139

(22) Filed: Sep. 20, 2002

(65) Prior Publication Data

US 2003/0052750 A1 Mar. 20, 2003

Related U.S. Application Data

(60) Provisional application No. 60/323,729, filed on Sep. 20, 2001.

(51) Int. Cl.$^7$ ................................................. H03H 7/12
(52) U.S. Cl. ...................... 333/174; 333/175; 333/178
(58) Field of Search .................. 333/174, 175, 333/167, 168, 177, 178, 185; 257/595

(56) References Cited

U.S. PATENT DOCUMENTS

| | | |
|---|---|---|
| 3,560,891 A | 2/1971 | MacLeay et al. |
| 4,275,364 A | 6/1981 | Skatvold, Jr. |
| 4,313,095 A | 1/1982 | Jean-Frederic |
| 4,821,007 A | 4/1989 | Fields et al. |
| 5,146,177 A | 9/1992 | Katz et al. |
| 5,270,673 A | 12/1993 | Fries et al. |
| 5,312,790 A | 5/1994 | Sengupta et al. |
| 5,334,959 A | 8/1994 | Krafcsik et al. |
| 5,349,364 A | 9/1994 | Bryanos et al. |
| 5,427,988 A | 6/1995 | Sengupta et al. |
| 5,486,491 A | 1/1996 | Sengupta et al. ........... 501/137 |
| 5,496,796 A | 3/1996 | Das |
| 5,593,495 A | 1/1997 | Masuda et al. ................. 117/4 |
| 5,606,283 A | 2/1997 | Allen et al. |
| 5,635,433 A | 6/1997 | Sengupta |
| 5,635,434 A | 6/1997 | Sengupta |
| 5,640,042 A | 6/1997 | Koscica et al. ............. 257/595 |
| 5,693,429 A | 12/1997 | Sengupta et al. |
| 5,694,134 A | 12/1997 | Barnes ....................... 343/700 |
| 5,766,697 A | 6/1998 | Sengupta et al. |
| 5,783,977 A | 7/1998 | Chethik |
| 5,830,591 A | 11/1998 | Sengupta et al. |
| 5,846,893 A | 12/1998 | Sengupta et al. |
| 5,886,867 A | 3/1999 | Chivukula et al. .......... 361/311 |
| 5,917,387 A * | 6/1999 | Rice et al. .................. 333/174 |
| 5,990,766 A | 11/1999 | Zhang et al. |

(List continued on next page.)

OTHER PUBLICATIONS

Junwei Lu, Robert Schlub & Takashi Ohira, "A Performance Comparison of Smart Antenna Technology for Wireless Mobile Computing Terminals"; ATR Adaptive Communications Research Laboratories, Kyoto, Japan; Proceedings of APCMC2001 Taipei, Taiwan, ROC; pp. 581–584.

(List continued on next page.)

Primary Examiner—Robert Pascal
Assistant Examiner—Dean Takaoka
(74) Attorney, Agent, or Firm—Law Office of Donald D. Mondul

(57) ABSTRACT

A tunable electrical filter constructed pursuant to the teachings of the present invention includes: (a) a plurality of resonator units coupled between an input locus and an output locus; and (b) a plurality of tunable dielectric varactor units; respective individual varactor units of the plurality of varactor units being coupled between respective pairs of the plurality of resonator units, coupled between the plurality of resonator units and the input locus, and coupled between the plurality of resonator units and the output locus.

16 Claims, 3 Drawing Sheets

U.S. PATENT DOCUMENTS

| | | | |
|---|---|---|---|
| 6,018,279 | A | 1/2000 | Arthur |
| 6,074,971 | A | 6/2000 | Chiu et al. |
| 6,078,228 | A | 6/2000 | Mannerstrale |
| 6,275,121 | B1 | 8/2001 | Sasaki et al. |
| 6,335,662 | B1 | 1/2002 | Del Rosario, Jr. et al. |
| 6,335,665 | B1 | 1/2002 | Mendelsohn |
| 6,377,142 | B1 | 4/2002 | Chiu et al. ............ 333/238 |
| 6,377,217 | B1 | 4/2002 | Zhu et al. ............ 343/700 |
| 6,377,440 | B1 | 4/2002 | Zhu et al. ............ 361/311 |
| 6,404,614 | B1 | 6/2002 | Zhu et al. ............ 361/277 |
| 6,407,719 | B1 | 6/2002 | Ohira et al. ............ 343/893 |
| 6,492,883 | B2 | 12/2002 | Liang et al. ............ 333/132 |
| 6,514,895 | B1 | 2/2003 | Chiu et al. ............ 501/137 |
| 6,518,859 | B1 * | 2/2003 | Spampinato ............ 333/174 |
| 6,525,630 | B1 | 2/2003 | Zhu et al. ............ 333/205 |
| 6,531,936 | B1 | 3/2003 | Chiu et al. ............ 333/164 |
| 6,535,076 | B2 | 3/2003 | Partridge et al. ............ 333/17.1 |
| 6,538,603 | B1 | 3/2003 | Chen et al. ............ 342/372 |
| 6,556,102 | B1 | 4/2003 | Sengupta et al. ............ 333/161 |
| 6,563,153 | B2 * | 5/2003 | Wikborg et al. ............ 257/295 |
| 6,590,468 | B2 | 7/2003 | du Toit et al. ............ 333/17.3 |
| 6,597,265 | B2 | 7/2003 | Liang et al. ............ 333/204 |

OTHER PUBLICATIONS

Takashi Ohira & Koichi Gyoda, "Electronically Steerable Passive Array Radiator Antennas for Low–Cost Analog Adaptive Beamforming"; ATR Adaptive Communications Research Laboratories, Kyoto, Japan.

Takashi Ohira & Koichi Gyoda; "Hand–Held Microwave Direction–of–Arrival Finder Based on Varactor–Tuned Analog Aerial Beamforming"; ATR Adaptive Communications Research Laboratories, Kyoto, Japan; ; Proceedings of APCMC2001 Taipei, Taiwan, ROC; pp. 585–588.

http://dictionary.reference.com.

The Science of Engineering and Materials by Donald R. Askeland; PWS Publishing Co., Boston, Third Edition; 1994; pp. 639–640; 641.

* cited by examiner

TUNABLE FILTERS HAVING VARIABLE BANDWIDTH AND VARIABLE DELAY

This application claims benefit of prior filed copending Provisional Patent Application Serial No. 60/323,729, filed Sep. 20, 2001.

FIELD OF INVENTION

This invention relates to electronic filters, and more particularly, to variable bandwidth bandpass filters.

BACKGROUND OF INVENTION

Electrically tunable filters have many uses in microwave and radio frequency systems. Compared to mechanically and magnetically tunable filters, electronically tunable filters have the important advantage of fast tuning capability over wide band application. Because of this advantage, they can be used in the applications such as, by way of example and not by way of limitation, LMDS (local multipoint distribution service), PCS (personal communication system), frequency hopping, satellite communication, and radar systems.

Filters for use in radio link communications systems have been required to provide better performance with smaller size and lower cost. Significant efforts have been made to develop new types of resonators, new coupling structures and new configurations for the filters. In some applications where the same radio is used to provide different capacities in terms of Mbits/sec, the intermediate frequency (IF) filter's bandwidth has to change accordingly. In other words, to optimize the performance of radio link for low capacity radios, a narrow band IF filter is used while for higher capacities wider band IF filters are needed. This requires using different radios for different capacities, because they have to use different IF filters. However, if the bandwidth of the IF filter could be varied electronically, the same configuration of radio could be used for different capacities which will help to simplify the architecture of the radio significantly, as well as reduce cost.

Traditional electronically tunable filters use semiconductor diode varactors to change the coupling factor between resonators. Since a diode varactor is basically a semiconductor diode, diode varactor-tuned filters can be used in various devices such as monolithic microwave integrated circuits (MMIC), microwave integrated circuits or other devices. The performance of varactors is defined by the capacitance ratio, $C_{max}/C_{min}$, frequency range, and figure of merit, or Q factor at the specified frequency range. The Q factors for semiconductor varactors for frequencies up to 2 GHz are usually very good. However, at frequencies above 2 GHz, the Q factors of these varactors degrade rapidly.

Since the Q factor of semiconductor diode varactors is low at high frequencies (for example, <20 at 20 GHz), the insertion loss of diode varactor-tuned filters is very high, especially at high frequencies (>5 GHz). Another problem associated with diode varactor-tuned filters is their low power handling capability. Further, since diode varactors are nonlinear devices, their handling of signals may generate harmonics and subharmonics.

Commonly owned U.S. patent application Ser. No. 09/419,219, filed Oct. 15, 1999, and titled "Voltage Tunable Varactors And Tunable Devices Including Such Varactors", discloses voltage tunable dielectric varactors that operate at room temperature and various devices that include such varactors, and is hereby incorporated by reference. Compared with the traditional semiconductor diode varactors, dielectric varactors have the merits of lower loss, higher power-handling, higher IP3, and faster tuning speed.

High power amplifiers are also an important part of any radio link. They are required to output maximum possible power with minimum distortion. One way to achieve this is to use feed forward amplifier technology. A typical feed forward amplifier includes two amplifiers (the main and error amplifiers), directional couplers, delay lines, gain and phase adjustment devices, and loop control networks. The main amplifier generates a high power output signal with some distortion while the error amplifier produces a low power distortion-cancellation signal.

In a typical feed forward amplifier, a radio frequency (RF) signal is input into a power splitter. One part of the RF signal goes to the main amplifier via a gain and phase adjustment device. The output of the main amplifier is a higher level, distorted carrier signal. A portion of this amplified and distorted carrier signal is extracted using a directional coupler, and after going through an attenuator, reaches a carrier cancellation device at a level comparable to the other part of the signal that reaches carrier cancellation device after passing through a delay line. The delay line is used to match the timing of both paths before the carrier cancellation device. The output of carrier cancellation device is a low level error or distortion signal. This signal, after passing through another gain and phase adjustment device, gets amplified by the low power amplifier. This signal is then subtracted from the main distorted signal with an appropriate delay to give the desired non-distorted output carrier.

Traditionally, delay lines have been used to give the desired delay and provide the above-described functionality. However, delay filters have become increasingly popular for this application because they are smaller, easily integrated with other components, and have lower insertion loss, as compared to their delay line counterpart. A fixed delay filter can be set to give the best performance over the useable bandwidth. This makes the operation of a feed forward amplifier much easier, as compared to the tuning of a delay line, which simulates adjustment of the physical length of a cable. However, fixed delay filters still have to be tuned manually.

There is a need for high performance, small size tunable bandwidth filters for wireless communications applications, as well as other applications. There is a further need for electronically tunable delay devices.

SUMMARY OF INVENTION

A tunable electrical filter constructed pursuant to the teachings of the present invention includes: (a) a plurality of resonator units coupled between an input locus and an output locus; and (b) a plurality of tunable dielectric varactor units; respective individual varactor units of the plurality of varactor units being coupled between respective pairs of the plurality of resonator units, coupled between the plurality of resonator units and the input locus, and coupled between the plurality of resonator units and the output locus.

A method for delaying an electrical signal includes the steps of: (a) Providing a plurality of resonator units coupled between an input locus and an output locus. (b) Providing a plurality of tunable dielectric varactor units. Respective individual varactor units of the plurality of varactor units are coupled between respective pairs of the plurality of resonator units, coupled between the plurality of resonator units and the input locus, and coupled between the plurality of resonator units and the output locus. Each respective individual varactor unit includes a substrate, a layer of voltage tunable dielectric material established in a first land on the substrate, a first electrode structure for receiving an electrical signal established in a second land on the first land, and a second electrode structure for receiving an electrical signal established in a third land on the first land. The first land and the second land are separated by a gap. (c) Applying the electrical signal to the input locus. (d) Applying a respective tuning voltage to the first electrode structure and the second electrode structure of each respective varactor unit. Each respective varactor unit exhibits a respective capacitance, the respective capacitance varying in response to the respective tuning voltage. (e) Receiving an output signal at the output locus. The output signal is delayed with respect to the electrical signal.

Tunable bandpass filters constructed in accordance with this invention include first and second resonators, an input, a first tunable dielectric varactor connecting the input to the first resonator, an output, a second tunable dielectric varactor connecting the second resonator to the output, and a third tunable dielectric varactor connecting the first and second resonators. The capacitance of the varactors can be controlled by applying a tuning voltage to each of the dielectric varactors, wherein the capacitance of each of the dielectric varactors varies substantially linearly with the tuning voltage.

Changing the capacitance of the tunable bandpass filters also changes the delay of signals passing through the filters. This makes the filters suitable for use in devices requiring a tunable delay function. Thus the invention also encompasses the use of such filters as tunable delay devices. In particular, the invention also encompasses a method of delaying an electrical signal, the method comprising the steps of: providing first and second resonators, an input, a first tunable dielectric varactor connecting the input to the first resonator, an output, a second tunable dielectric varactor connecting the second resonator to the output, and a third tunable dielectric varactor connecting the first and second resonators; coupling the electrical signal to the input; and extracting a delayed version of the electrical signal at the output.

The invention further encompasses a feed forward amplifier comprising an input port, a signal splitter coupled to the input port for producing first and second signals, a main amplifier for amplifying the first signal to produce an amplified first signal, a voltage tunable dielectric varactor delay filter for delaying the second signal to produce a delayed second signal, a first combiner for combining a portion of the amplified first signal with the delayed second signal to produce an error signal, an error signal amplifier for amplifying the error signal to produce an amplified error signal, and a second combiner for combining the amplified first signal and the amplified error signal. The voltage tunable dielectric varactor delay filter comprises an input, a first resonator, a first tunable dielectric varactor connected between the input and the first resonator, an output, a second resonator, a second tunable dielectric varactor connected between the output and the second resonator, and a third tunable dielectric varactor connected between the first resonator and the second resonator.

DESCRIPTION OF THE PREFERRED EMBODIMENTS

Figure 1:
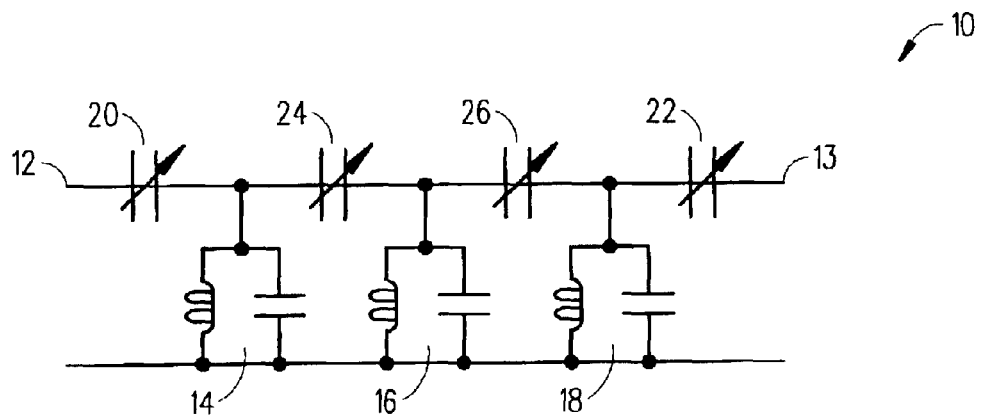
FIG. 1 is a schematic representation of a lumped element tunable bandwidth band-pass filter constructed in accordance with this invention.

Referring to the drawings, FIG. 1 is a schematic representation of a lumped element tunable bandwidth band-pass filter 10 constructed in accordance with this invention. Filter 10 includes an input 12, an output 13 and a plurality of resonators 14, 16, 18. A first voltage tunable dielectric access varactor 20 couples input 12 with resonator 14. A second voltage tunable access dielectric varactor 22 couples output 13 with resonator 18. Additional intercavity varactors 24, 26 are connected between adjacent resonators 14, 16, 18. Each of voltage tunable access varactors 20, 22 and each of voltage tunable intercavity or varactors 24, 26 includes a voltage tunable dielectric material having a dielectric constant that varies with an applied control voltage, also called a bias voltage. By changing the control voltage for a respective varactor 20, 22, 24, 26, the capacitance of the respective varactor 20, 22, 24, 26 changes.

In tunable bandwidth bandpass filter 10 (FIG. 1), the coupling between adjacent resonators 14, 16, 18 is achieved by a variable intercavity capacitor or varactor 24, 26. By changing the bias voltage of a respective intercavity varactor 24, 26 its capacitance value will change which provides a change in coupling factor. Similarly, access coupling of input 12 through access varactor 20 or access coupling of output 13 through access varactor 22 can be controlled by tuning appropriate access varactors 20, 22. Bandwidth of filter 10 is defined by intercavity coupling (i.e., coupling among resonators 14, 16, 18), as well as access coupling through access varactors 20, 22 Therefore, by tuning these various couplings the bandwidth of filter 10 can be tuned or changed.

When varactors 20, 22, 24, 26 are biased, their capacitance values are smaller, resulting in smaller coupling factors. A consequence of such smaller coupling factors is that filter 10 exhibits a narrower bandwidth. Resonators and coupling structures appropriate for employment in filter 10 may be embodied in different topologies. For example, resonators may be configured as lumped elements for high frequency (HF) applications. Coaxial cavities or transmission lines based on coaxial, microstrip, or stripline lines can be used for low frequency RF applications. Dielectric resonators or waveguides can be used for higher frequency applications. The coupling mechanism between resonators can be capacitive or inductive.

For bandpass filters with a Tchebyscheff response, the following equations relate the bandwidth (BW) to intercavity coupling $k_{jj+1}$ and access coupling $Q_e$ according to Tchebyscheff model, $$k_{j,j} = \frac{BW}{F_o\sqrt{g_j \cdot g_{j+1}}}$$

$$Q_e = \frac{F_o \cdot g_j}{BW}$$

where $g_j$ are from Tchebyscheff model, BW is the bandwidth, and $F_o$ is the center frequency.

Figure 2:
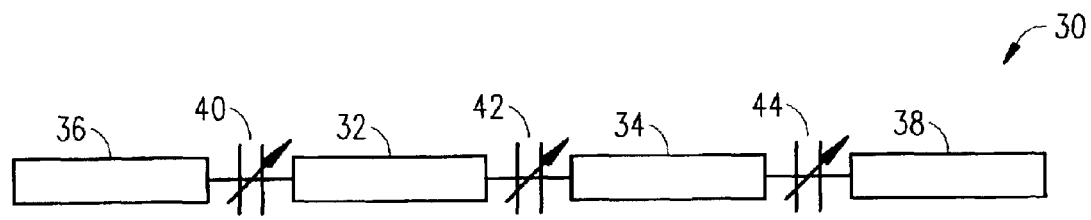
FIG. 2 is a schematic representation of an edged coupled microstrip line band-pass filter with tunable varactors.

FIG. 2 shows another example of a tunable bandwidth filter 30 constructed in accordance with this invention using microstrip technology. Filter 30 includes two edge coupled microstrip line resonators 32, 34. An input microstrip line resonator 36 is provided for delivering a signal to filter 30. An output microstrip line resonator 38 is provided for receiving a signal from filter 30. In order to tune the bandwidth of filter 30, the coupling factor between resonators, as well as, between input/output transmission lines and the resonators should be changed. Tunable varactors 40, 42 and 44 are provided for coupling resonators 32, 34, 36, 38. Varactors 40, 42, 44 are coupled between resonators 32, 34, 36, 38. Changing bias voltage to a respective varactor 40, 42, 44 changes the capacitance value for the respective varactor 40, 42, 44 which changes the coupling factor for the respective varactor 40, 42, 44. By effecting changes in the coupling factors of respective varactors 40, 42, 44, the bandwidth of filter 30 may be altered. Both the access coupling and intercavity couplings are capacitive in this exemplary embodiment illustrated in FIG. 2.

As illustrated by exemplary filters 10, 30 (FIGS. 1 and 2), electrically tunable bandwidth filters use electronically tunable varactors to tune intercavity coupling, thus varying the coupling factor between the resonators, as well as, access coupling. The varactor capacitance may be variously changed among respective varactors by applying different bias voltages to different varactors. In such manner the coupling factors of various varactors may be varied, and bandwidth of the filter in which the varactors are employed may be adjusted.

Figure 3:
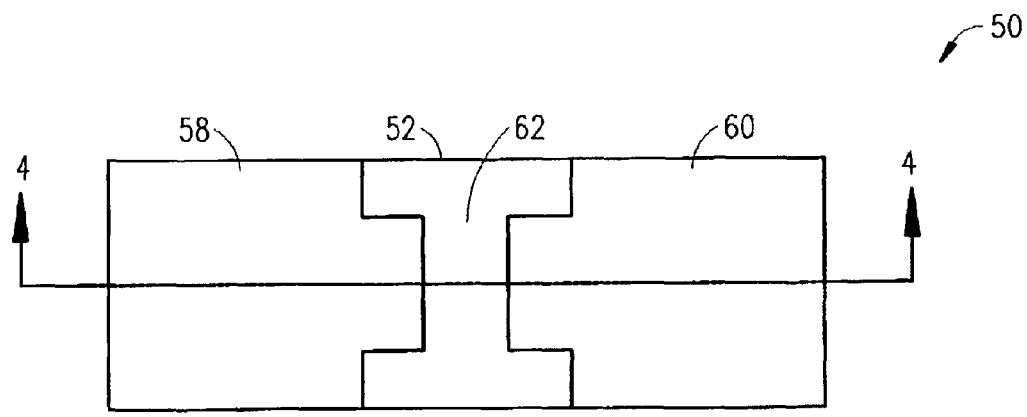
FIG. 3 is a top plan view of a varactor that can be used in the filters of this invention.
Figure 4:
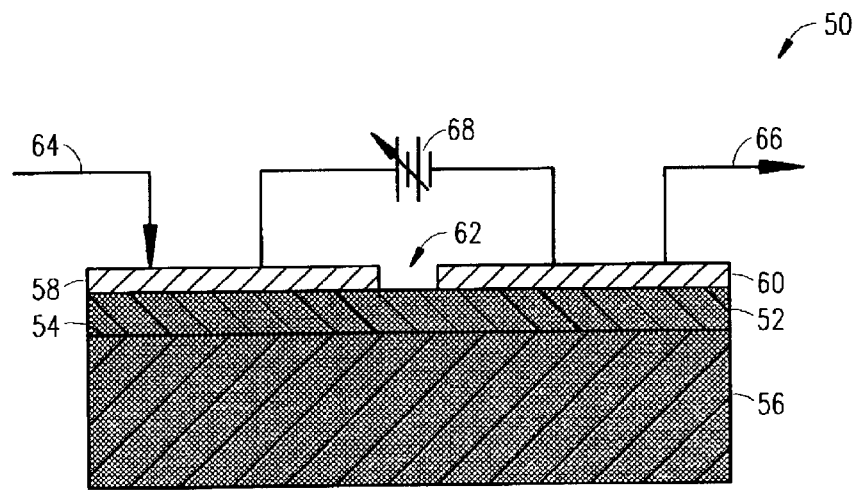
FIG. 4 is a cross-sectional view of the varactor of FIG. 3, taken along section 4—4 of FIG. 3.

FIG. 3 is a top plan view of a varactor 50 that can be used in the filters of this invention. FIG. 4 is a cross-sectional view of the varactor of FIG. 3, taken along section 4—4 of FIG. 3. In FIGS. 3 and 4, a varactor 50 includes a layer 52 of voltage tunable dielectric material positioned on a surface 54 of a low loss, low dielectric substrate 56. A pair of electrodes 58, 60 are positioned on layer 52 and separated by a gap 62. An input line 64 is connected with electrode 58 and an output line 66 is connected with electrode 60. A variable DC voltage source 68 is connected between electrodes 58, 60 to supply a control voltage to varactor 50. By changing the control voltage provided by voltage source 58, the capacitance of varactor 50 can be altered.

Filters configured according to the teachings of the present invention (e.g., filter 10, FIG. 1; filter 30, FIG. 2; filter 50, FIGS. 3 and 4) have low insertion loss, fast tuning speed, high power-handling capability, high IP3 and low cost in the microwave frequency range. Compared to the semiconductor diode varactors, voltage-controlled tunable dielectric capacitors have higher Q factors, higher power-handling and higher IP3. Voltage-controlled tunable dielectric capacitors (e.g., varactors 20, 22, 24, 26, FIG. 1; varactors 40, 42, 44, FIG. 2; varactor 50, FIG. 3) have a capacitance that varies approximately linearly with applied voltage and can achieve a wider range of capacitance values than is possible with semiconductor diode varactors.

Figure 5:
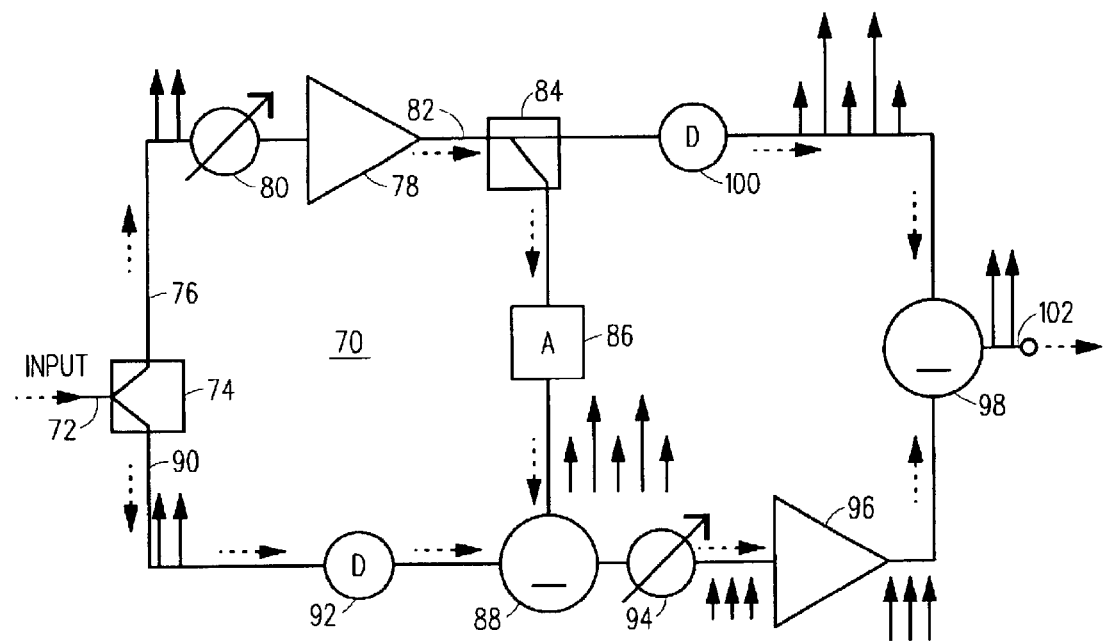
FIG. 5 is a schematic representation of feed forward amplifier that uses a tunable delay filter in accordance with this invention.

Filters 10, 30, 50 described above can also serve as tunable delay filters. Tunable delay filters can be used in various devices, such as feed forward amplifiers. FIG. 5 is a schematic representation of feed forward amplifier 70 including tunable delay filters in accordance with this invention. A radio frequency (RF) signal is input to an input port 72 and split by a signal splitter 74 into first and second parts. The first part on a line 76 goes to a main amplifier 78 via a gain and phase adjustment device 80. The output of main amplifier 78 on line 82 is a high level, distorted carrier signal. A portion of this amplified and distorted carrier signal is extracted using a directional coupler 84 and provided to a carrier cancellation device 88 via an attenuator 86.

The second part of the RF signal received at signal splitter 74 is directed on a line 90 to carrier cancellation device 88 via a delay device 92. Delay device 92 is configured to phase match signals arriving at carrier cancellation device 88 from lines 76, 90. The signal arriving at carrier cancellation device 88 goes to a main amplifier 78 via a gain and phase adjustment device 80.

The output of carrier cancellation device 88 is a low level error or distortion signal. This signal, after passing through another gain and phase adjustment device 94, is amplified by a low power amplifier 96. An output signal from low power amplifier 96 is provided to a subtractor device 98. A main distorted signal is provided to subtractor 98 from directional coupler 84 via a delay device 100. Subtractor 98 produces a difference signal at an output 102 representing the difference between signals provided to subtractor 98 from delay device 100 and from low power amplifier 96. The difference signal appearing at output 102 the desired non-distorted output carrier signal.

One or both of the delay devices 92, 100 in FIG. 5 can be a tunable delay filter. By changing the bias voltage of varactor 42 in filter 30 (FIG. 2), for example, its capacitance value will change which provides a change in its coupling factor. Similarly the input/output access coupling for filter 30 can be varied by tuning the corresponding varactors 40, 42. Changing the coupling factors of filter 30 changes the bandwidth, which will result in changing the group delay. Therefore, by tuning the coupling varactors 40, 42 the group delay of filter 30 can be changed.

Resonators and coupling structures can be embodied in different topologies. For example, resonators can be lumped elements for HF applications; coaxial cavities or transmission lines based on coaxial lines, microstrip lines, or stripline lines can be used for low frequency RF applications; and dielectric resonators or waveguides can be used for higher frequency applications. Coupling structures can be capacitive or inductive. The above described structures are only examples. Electronically tunable varactors can be used to tune the coupling factors and hence the bandwidth of any bandpass filter design to provide variable group delay.

The invention also encompasses a method of delaying an electrical signal, the method comprising the steps of: providing first and second resonators, an input, a first tunable dielectric varactor connecting the input to the first resonator, an output, a second tunable dielectric varactor connecting the second resonator to the output, and a third tunable dielectric varactor connecting the first and second resonators; coupling the electrical signal to the input; and extracting a delayed version of the electrical signal at the output.

The tunable dielectric varactors in the preferred embodiments of the present invention can include a low loss (Ba,Sr)TiO$_3$-based composite film. The typical Q factor of the tunable dielectric capacitors is 200 to 500 at 2 GHz with capacitance ratio ($C_{max}/C_{min}$) around 2. A wide range of capacitance of the tunable dielectric capacitors is variable, say 0.1 pF to 10 pF. The tuning speed of the tunable dielectric capacitor is less than 30 ns. The practical tuning speed is determined by auxiliary bias circuits. The tunable dielectric capacitor may be a packaged two-port component, in which tunable dielectric material can be voltage-controlled. The tunable film may preferably be deposited on a substrate, such as MgO, LaAlO$_3$, sapphire, Al$_2$O$_3$ and other dielectric substrates. An applied voltage produces an electric field across the tunable dielectric, which produces a change in the capacitance of the tunable dielectric capacitor.

Tunable dielectric materials have been described in several patents. Barium strontium titanate ($BaTiO_3$—$SrTiO_3$), also referred to as BSTO, is used for its high dielectric constant (200–6,000) and large change in dielectric constant with applied voltage (25–75 percent with a field of 2 Volts/micron). Tunable dielectric materials including barium strontium titanate are disclosed in U.S. Pat. No. 5,427,988 by Sengupta, et al. entitled "Ceramic Ferroelectric Composite Material-BSTO—MgO"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO—ZnO"; U.S. Pat. No. 6,074,971 by Chiu et al. entitled "Ceramic Ferroelectric Composite Materials with Enhanced Electronic Properties BSTO—Mg Based Compound-Rare Earth Oxide". These patents are incorporated herein by reference.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)_5$ $KH_2PO_4$, and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. patent applications, assigned to the assignee of this application, disclose additional examples of tunable dielectric materials: U.S. application Ser. No. 09/594,837 filed Jun. 15, 2000, entitled "Electronically Tunable Ceramic Materials Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; U.S. application Ser. No. 09/834,327 filed Apr. 13, 2001, entitled "Strain-Relieved Tunable Dielectric Thin Films"; and U.S. provisional application Serial No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Thick films of tunable dielectric composites can comprise $Ba_{1-x}Sr_xTiO_3$, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components or two or more of these components in quantities from 0.25 weight percent to 80 weight percent with BSTO weight ratios of 99.75 weight percent to 20 weight percent.

The electronically tunable materials can also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3\text{-}5H_2O$, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase.

Additional metal silicates may include $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides.

Preferred additional metal oxides include $Mg_2SiO_4$, MgO, $CaTiO_3$, $MgZrSrTiO_6$, $MgTiO_3$, $MgAl_2O_4$, $WO_3$, $SnTiO_4$, $ZrTiO_4$, $CaSiO_3$, $CaSnO_3$, $CaWO_4$, $CaZrO_3$, $MgTa_2O_6$, $MgZrO_3$, $MnO_2$, $PbO$, $Bi_2O_3$ and $La_2O_3$. Particularly preferred additional metal oxides include $Mg_2SiO_4$, $MgO$, $CaTiO_3$, $MgZrSrTiO_6$, $MgTiO_3$, $MgAl_2O_4$, $MgTa_2O_6$ and $MgZrO_3$.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

In one embodiment, the additional metal oxide phases may include at least two Mg-containing compounds. In addition to the multiple Mg-containing compounds, the material may optionally include Mg-free compounds, for example, oxides of metals selected from Si, Ca, Zr, Ti, Al and/or rare earths. In another embodiment, the additional metal oxide phases may include a single Mg-containing compound and at least one Mg-free compound, for example, oxides of metals selected from Si, Ca, Zr, Ti, Al and/or rare earths. The high Q tunable dielectric capacitor utilizes low loss tunable substrates or films.

To construct a tunable device, the tunable dielectric material can be deposited onto a low loss substrate. In some instances, such as where thin film devices are used, a buffer layer of tunable material, having the same composition as a main tunable layer, or having a different composition can be inserted between the substrate and the main tunable layer. The low loss dielectric substrate can include magnesium oxide (MgO), aluminum oxide ($Al_2O_3$), and lanthium oxide ($LaAl_2O_3$).

When the bias voltage or bias field is changed, the dielectric constant of the voltage tunable dielectric material ($\in_r$) will change accordingly, which will result in a tunable varactor. Compared to semiconductor varactor based tunable filters, the tunable dielectric capacitor based tunable filters of this invention have the merits of lower loss, higher power-handling, and higher IP3, especially at higher frequencies (>10 GHz). It is observed that between 50 and 300 volts a nearly linear relation exists between Cp and applied Voltage.

In microwave applications the linear behavior of a dielectric varactor is very much appreciated, since it will assure very low Inter-Modulation Distortion and consequently a high IP3 (Third-order Intercept Point). Typical IP3 values for diode varactors are in the range 5 to 35 dBm, while that of a dielectric varactor is greater than 50 dBm. This will result in a much higher RF power handling capability for a dielectric varactor.

Another advantage of dielectric varactors compared to diode varactors is the power consumption. The dissipation factor for a typical diode varactor is in the order of several hundred milliwatts, while that of the dielectric varactor is about 0.1 mW.

Diode varactors show high Q only at low microwave frequencies so their application is limited to low frequencies, while dielectric varactors show good Q factors up to millimeter wave region and beyond (up to 60 GHz).

Tunable dielectric varactors can also achieve a wider range of capacitance (from 0.1 pF all the way to several $\mu F$), than is possible with diode varactors. In addition, the cost of dielectric varactors is less than diode varactors, because they can be made more cheaply.

High frequency, radio frequency, and microwave bandpass filters of this invention include a number of resonators and some coupling structures. The resonators can be lumped elements, any type of transmission lines, dielectric resonators, waveguides, or other resonating structures. The coupling mechanism between the adjacent resonators as well as the access transmission line and first and last resonators can be tuned electronically by using tunable dielectric varactors. Tuning the coupling factors of the bandpass filter results in tunable bandwidth filter.

Electronically tunable dielectric varactors may be used to make tunable delay filters. The invention also relates to compact, high performance, low loss, and low cost tunable delay filters. These compact tunable delay filters are increasingly being used in feed-forward or pre-distortion technologies used in high power amplifiers in wireless communication base stations and other communication systems. The high Q varactor using low loss tunable dielectric material films leads to high performance tunable delay filters with significant advantages over fixed delay filters and coaxial cable delay lines.

The electronically tunable delay filters of this invention use electronically tunable varactors to tune the group delay of the filter. When the varactor capacitance is changed by applying different bias voltages, the coupling factors between the filter resonators are varied, which result in a change in filter group delay value. Electrically tunable delay filters based on dielectric varactors have important advantages such as high Q, small size, lightweight, low power consumption, simple control circuits, and fast tuning capability. Compared with semiconductor diode varactors, dielectric varactors have the merits of lower loss, higher power-handling, higher IP3, faster tuning speed, and lower cost.

The tunable delay filters include a number of resonators and some coupling structures. The resonators can be lumped element, any type of transmission line, dielectric resonator, waveguide, or another resonator structure. The coupling mechanism between the adjacent resonators as well as the access transmission line and first and last resonators can be tuned electronically by using voltage tunable dielectric varactors. Tuning the coupling factors of the bandpass filter will result in tunable delay filter. Some filter examples are provided, but the patent is not limited to those structures.

This invention provides an effective way of designing a tunable delay filter. When used in a feed forward amplifier the filters provide an easy way of inducing delay as well as tuning delay to obtain distortion free output signals from power amplifiers. Improved tuning delay can result in better modulated signals. Tunable delay filters can reduce the system cost and significantly improve the quality of radio link.

This invention provides electrically tunable bandwidth and tunable delay filters having high Q, small size, light weight, low power consumption, simple control circuits, and fast tuning capability.

Figure 6:
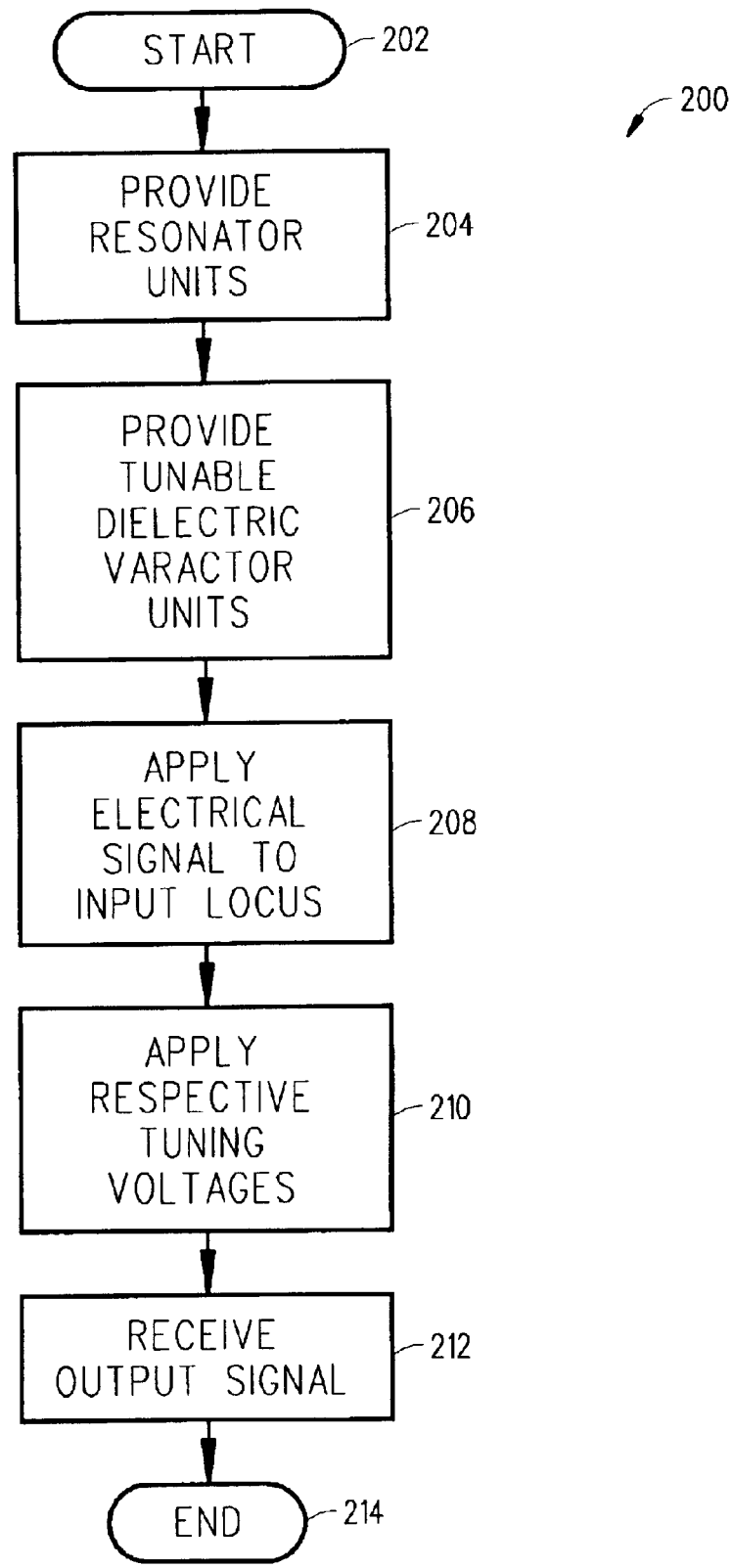
FIG. 6 is a flow diagram illustrating the method of the present invention.

FIG. 6 is a flow diagram illustrating the method of the present invention. In FIG. 6, a method 200 for delaying an electrical signal begins at a START locus 202. Method 200 continues with providing a plurality of resonator units coupled between an input locus and an output locus, as indicated by a block 204.

Method 200 continues with providing a plurality of tunable dielectric varactor units, as indicated by a block 206.

Respective individual varactor units of the plurality of varactor units are coupled between respective pairs of the plurality of resonator units, coupled between the plurality of resonator units and the input locus, and coupled between the plurality of resonator units and the output locus. Each respective individual varactor unit includes a substrate, a layer of voltage tunable dielectric material established in a first land on the substrate, a first electrode structure for receiving an electrical signal established in a second land on the first land, and a second electrode structure for receiving an electrical signal established in a third land on the first land. The first land and the second land are separated by a gap.

Method 200 continues with applying the electrical signal to the input locus, as indicated by a block 208. Method 200 continues with applying a respective tuning voltage to the first electrode structure and the second electrode structure of each respective varactor unit, as indicated by a block 210. Each respective varactor unit exhibits a respective capacitance. The respective capacitance varies in response to the respective tuning voltage.

Method 200 continues with receiving an output signal at the output locus, as indicated by a block 212. The output signal is delayed with respect to the electrical signal. Method 200 then terminates, as indicated by an END locus 214.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A tunable bandwidth filter having a substantially fixed frequency comprising:
   (a) an input locus for receiving input signals to the filter; said input locus being coupled with at least one conductive member;
   (b) an output locus for presenting output signals from the filter; said output locus being coupled with said at least one conductive member;
   (c) a plurality of fixed resonator units; said plurality of resonator units being coupled with said at least one conductive member; and
   (d) at least one tunable dielectric varactor unit; each respective tunable dielectric varactor unit of said at least one tunable dielectric varactor unit being coupled with said at least one conductive member at a respective intermediate locus; each said respective intermediate locus being situated between a respective pair of said plurality of resonator units; each respective tunable dielectric varactor unit of said at least one tunable dielectric varactor unit comprising a substrate, a layer of voltage tunable dielectric material established in a first area on said substrate, a first electrode structure for receiving an electrical signal established in a second area on said first area, and a second electrode structure for receiving an electrical signal established in a third area on said first area; said second area and said third area being separated by a gap; said voltage tunable dielectric material being a paraelectric material having an operating temperature greater than its Curie temperature.

2. A tunable bandwidth filter having a substantially fixed frequency as recited in claim 1 wherein respective resonator units of said plurality of resonator units comprise one of a coaxial cavity, a transmission line, a dielectric resonator or a waveguide.

3. A tunable bandwidth filter having a substantially fixed frequency as recited in claim 1 wherein the tunable electrical filter further comprises:
   (e) at least one access tunable dielectric varactor unit; a respective access tunable dielectric varactor unit of said at least one access tunable dielectric varactor unit being coupled with at least one of said input locus and said output locus.

4. A tunable bandwidth filter having a substantially fixed frequency as recited in claim 1 wherein said plurality of resonator units are a plurality of microstrip units; said at least one conductive member being one conductive member; said plurality of microstrip units being coupled in series between said input locus and said output locus.

5. A tunable bandwidth filter having a substantially fixed frequency as recited in claim 1 wherein each respective resonator unit of said plurality of resonator units is coupled in parallel from a respective first connection locus at a first conductive member of said at least one conductive member and a respective second connection locus at a second conductive member of said at least one conductive member.

6. A tunable bandwidth filter having a substantially fixed frequency as recited in claim 4 wherein the tunable electrical filter further comprises:
   (e) at least one access tunable dielectric varactor unit; a respective access tunable dielectric varactor unit of said at least one access tunable dielectric varactor unit being coupled with at least one of said input locus and said output locus.

7. A tunable bandwidth filter having a substantially fixed frequency as recited in claim 5 wherein the tunable electrical filter further comprises:
   (e) at least one access tunable dielectric varactor unit; a respective access tunable dielectric varactor unit of said at least one access tunable dielectric varactor unit being coupled with at least one of said input locus and said output locus.

8. A tunable bandwidth filter having a substantially fixed frequency as recited in claim 3, 6, or 7 wherein each respective access tunable dielectric varactor unit of said at least one access tunable dielectric varactor unit comprises a substrate; a layer of voltage tunable dielectric material established in a first area on said substrate; a first electrode structure for receiving an electrical signal established in a second area on said first area; a second electrode structure for receiving an electrical signal established in a third area on said first area; said second area and said third area being separated by a gap.

9. A tunable bandwidth filter having a substantially fixed frequency comprising:
   (a) a plurality of fixed resonator units coupled between an input locus and an output locus; and
   (b) a plurality of tunable dielectric varactor units; respective individual varactor units of said plurality of varactor units being coupled between respective pairs of said plurality of resonator units, coupled between said plurality of resonator units and said input locus, and coupled between said plurality of resonator units and said output locus; each respective tunable dielectric varactor unit of said plurality of tunable dielectric varactor units comprising a substrate, a layer of voltage tunable dielectric material established in a first area on said substrate, a first electrode structure for receiving an electrical signal established in a second area on said first area, and a second electrode structure for receiving an electrical signal established in a third area on said first area; said second area and said third area being separated by a gap; said voltage tunable dielectric material being a paraelectric material having an operating temperature greater than its Curie temperature.

10. A tunable bandwidth filter having a substantially fixed frequency as recited in claim 9 wherein respective resonator units of said plurality of resonator units comprise one of a coaxial cavity, a transmission line, a dielectric resonator or a waveguide.

11. A method for delaying an electrical signal comprising the steps of:
  (a) providing a plurality of fixed resonator units coupled between an input locus and an output locus;
  (b) providing a plurality of tunable dielectric varactor units; respective individual varactor units of said plurality of varactor units being coupled between respective pairs of said plurality of resonator units, coupled between said plurality of resonator units and said input locus, and coupled between said plurality of resonator units and said output locus; each said respective individual varactor unit comprising a substrate; a layer of voltage tunable dielectric material established in a first area on said substrate; a first electrode structure for receiving an electrical signal established in a second lend area on said first area; a second electrode structure for receiving an electrical signal established in a third area on said first area; said second area and said third area being separated by a gap;
  (c) applying said electrical signal to said input locus;
  (d) applying a respective tuning voltage to said first electrode structure and said second electrode structure of each said respective varactor unit; each said respective varactor unit being configured of a paraelectric material having an operating temperature greater than its Curie temperature and exhibiting a respective capacitance; said respective capacitance varying in response to said respective tuning voltage; and
  (e) receiving an output signal at said output locus; said output signal being delayed with respect to said electrical signal.

12. A method for delaying an electrical signal as recited in claim 11 wherein respective resonator units of said plurality of resonator units comprise one of a coaxial cavity, a transmission line, a dielectric resonator or a waveguide.

13. A tunable bandwidth filter having a substantially fixed frequency; the filter comprising:
  (a) an input locus for receiving input signals;
  (b) an output locus for resenting output signals from the filter;
  (c) a plurality of tunable varactor units coupled in series between said input locus and said output locus; and
  (d) a plurality of resonator units; each respective resonator unit of said plurality of resonator units being coupled between adjacent tunable varactor units of said plurality of tunable varactor units; each respective tunable varactor unit of said plurality of tunable varactor units comprising a substrate, a layer of voltage tunable dielectric material applied in a first area on said substrate, a first electrode structure for receiving an electrical signal established in a second area on said first area, and a second electrode structure for receiving an electrical signal established in a third area on said first area; said second area and said third area being separated by a gap.

14. A tunable bandwidth filter having a substantially fixed frequency as recited in claim 13 wherein said voltage tunable dielectric material is a paraelectric material having an operating temperature greater than its Curie temperature.

15. A tunable bandwidth filter having a substantially fixed frequency s recited in claim 13 wherein respective resonator units of said plurality of resonator units comprise one of a coaxial cavity, a transmission line, a dielectric resonator or a waveguide.

16. A tunable bandwidth filter having a substantially fixed frequency as recited in claim 13 wherein said plurality of resonator units are a plurality of microstrip units; said plurality of microstrip units being coupled in series between said input locus and said output locus; each respective microstrip unit of said plurality microstrip units being coupled between adjacent tunable varactor units of said plurality of tunable varactor units.

* * * * *